United States Patent
Lyons et al.

(10) Patent No.: US 6,270,929 B1
(45) Date of Patent: Aug. 7, 2001

(54) DAMASCENE T-GATE USING A RELACS FLOW

(75) Inventors: Christopher F. Lyons, Fremont; Ramkumar Subramanian, San Jose; Bhanwar Singh, Morgan Hill; Marina Plat, San Jose, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/619,789

(22) Filed: Jul. 20, 2000

(51) Int. Cl.[7] .................................................. H01L 21/302
(52) U.S. Cl. .............................. 430/5; 438/725; 438/579; 438/637; 438/638; 438/585; 438/723; 438/734; 438/750
(58) Field of Search ............................. 430/5; 438/701, 438/579, 637, 638, 585, 725, 723, 734, 756, 750

(56) References Cited

U.S. PATENT DOCUMENTS

| | | | |
|---|---|---|---|
| 4,283,483 | * 8/1981 | Coane | 430/296 |
| 5,006,478 | * 4/1991 | Kobayashi et al. | 437/41 |
| 5,155,053 | * 10/1992 | Atkinson | 437/44 |
| 5,688,700 | * 11/1997 | Kao et al. | 437/29 |
| 6,033,952 | * 3/2000 | Yasumura et al. | 438/253 |
| 6,121,113 | * 9/2000 | Takatsuka et al. | 438/424 |

FOREIGN PATENT DOCUMENTS

| | | |
|---|---|---|
| 02-191348 | * 7/1990 | (JP) . |
| 05-090220 | * 4/1993 | (JP) . |
| 07-111241 | * 4/1995 | (JP) . |
| 10-333341 | * 12/1998 | (JP) . |
| 2000-133636 | * 5/2000 | (JP) . |

* cited by examiner

*Primary Examiner*—Gregory Mills
*Assistant Examiner*—George Goudreau
(74) *Attorney, Agent, or Firm*—Amin & Turocy, LLP

(57) ABSTRACT

A method for fabricating a T-gate structure is provided. A structure is provided that has a silicon layer having a gate oxide layer, a polysilicon layer over the gate oxide layer and an insulating layer over the gate oxide layer. A photoresist layer is formed over the insulating layer. An opening is the formed extending through the photoresist layer and partially into the insulating layer. The opening in the insulating layer extends from a top surface of the insulating layer to a first depth. The photoresist layer is swelled to reduce the size of the opening in the photoresist layer. The opening is then extended in the insulating layer from the first depth to a second depth. The opening is wider from the top surface of the insulating layer to the first depth than the opening is from the first depth to the second depth. The opening is then filled with a conductive material to form a T-gate structure.

20 Claims, 5 Drawing Sheets

DAMASCENE T-GATE USING A RELACS FLOW

TECHNICAL FIELD

The present invention generally relates to semiconductor processing, and in particular to a method for forming a gate structure with a contact area wider than a base area.

BACKGROUND OF THE INVENTION

Historically, gate structures having a base area with a width that is smaller than the gate contact area (e.g. T-gate and Y-gate structures) have been advantageous in several technologies. For example, MESFET, HEMT (variant of gallium arsenide field effect transistor technology) mainly used in satellite broadcasting receivers, high speed logic circuits and power modules have employed gate structures with bases smaller than the contact area. These types of devices are required in field effect transistors for operation in ultra-high frequency ranges. The advantage of employing a gate structure with a shorter gate length is that the channel of the gate is reduced resulting in an increased in speed and a decrease in power consumption. Reducing the distance over which the gate's field effect control of the electrons in the channel reduces the parasitic resistances and capacitances that limit device speed. A shorter gate length decreases the transmit time for carriers in the channel but also increases the series resistance of the gate electrode itself, slowing down the device and degrading the frequency characteristics of the device. Providing a gate structure with a smaller base than its contact area decreases the gate channel while providing a low gate series resistance due to the wider contact area and, thus, improving the devices drive current capability and performance.

In the semiconductor industry, there is a continuing trend toward higher device densities. To achieve these high densities there has been and continues to be efforts toward scaling down device dimensions at submicron levels on semiconductor wafers. In order to accomplish such high device packing density, smaller and smaller feature sizes are required. This may include the width and spacing of interconnecting lines and the surface geometry such as corners and edges of various features.

The requirement of small features with close spacing between adjacent features requires high resolution photolithographic processes. In general, lithography refers to processes for pattern transfer between various media. It is a technique used for integrated circuit fabrication in which a silicon slice, the wafer, is coated uniformly with a radiation-sensitive film, the resist, and an exposing source (such as optical light, x-rays, or an electron beam) illuminates selected areas of the surface through an intervening master template, the mask, for a particular pattern. The lithographic coating is generally a radiation-sensitive coating suitable for receiving a projected image of the subject pattern. Once the image is projected, it is indelibly formed in the coating. The projected image may be either a negative or a positive of the subject pattern. Exposure of the coating through a photomask causes the image area to become either more or less soluble (depending on the coating) in a particular solvent developer. The more soluble areas are removed in the developing process to leave the pattern image in the coating as less soluble polymer.

Recent advances in CMOS transistor architecture make use of the T-gate or Y-gate structures where the polysilicon gate electrode is narrowed in the gate regions and wider on top of the gate. This is due to the ever increasing demand for scaling down semiconductor devices and scaling down power consumption requirements. However, the current methods for forming a gate structure with a contact region wider than its base suffers from shortcomings. For example, the etch process which narrows the base of the structure are known to be difficult to control especially with local pattern density. This can lead to variation in the gate width and asymmetric implant profiles. Another problem is related to manufacturing controls. The "re-entrant" or overhung profile prevents direct measurement of the critical gate length.

In view of the above, there is an unmet need for improvements in methodologies for formation of gate structures with contact areas that are wider than the base area.

SUMMARY OF THE INVENTION

The present invention employs a damascene or inlaid process for forming a T-shaped gate electrode. A gate dielectric is grown over a silicon material. A very thin deposition of gate electrode material such as polysilicon is deposited over the gate dielectric material. A damascene "stencil" material or insulating material, such as an oxide, is then deposited to a thickness required for the final gate electrode thickness. A lithographic pattern is used to define a first opening in a "stencil film such as $SiO_2$. The width of the lithographically defined structure is greater that the final gate length. The depth of the opening is less than the full oxide film thickness and can be controlled by a timed etch process. The next process step is to shrink the width of the lithographic pattern to the extent needed to achieve a final gate length. Methods for swelling resist are employed. A second etch completes the removal of the stencil in the gate region and defines the base of the T-gate and the resist material is then stripped. Standard SEM metrology can monitor the critical gate length. A standard polysilicon deposition and polish can be employed after removal of the resist. The stencil or oxide material is then removed and the exposed portion of the original thin polysilicon layer completes the formation of the desired T-gate structure.

One aspect of the invention relates to a method for fabricating a T-gate structure. A structure is provided that has a silicon layer having a gate oxide layer, a polysilicon layer over the gate oxide layer and an insulating layer over the gate oxide layer. A photoresist layer is formed over the insulating layer. An opening is the formed extending through the photoresist layer and partially into the insulating layer. The opening in the insulating layer extends from a top surface of the insulating layer to a first depth. The photoresist layer is swelled to reduce the size of the opening in the photoresist layer. The opening is then extended in the insulating layer from the first depth to a second depth. The opening is wider from the top surface of the insulating layer to the first depth than the opening is from the first depth to the second depth. The opening is then filled with a conductive material.

Another aspect of the present invention relates to another method for fabricating a T-gate structure. A structure is provided that has a silicon layer having a gate oxide layer, a polysilicon layer over the gate oxide layer and an insulating layer over the gate oxide layer. A photoresist layer is formed over the insulating layer. The photoresist layer is etched to form an opening in the photoresist layer exposing a portion of the underlying insulating layer. Another etching is performed on the exposed insulating layer to extend the opening partially into the insulating layer. The opening in the insulating layer extends from a top surface of the insulating layer to a first depth. The photoresist layer is swelled to reduce the size of the opening in the photoresist layer. Yet another etch step is performed to extend the opening in the insulating layer from the first depth to a second depth. The opening is wider from the top surface of the insulating layer to the first depth than the opening is from the first depth to the second depth. The opening is then filled with a conductive material. The insulating layer and the gate oxide and polysilicon layer underlying the conductive material are then removed.

Yet another aspect of the present invention provides for yet another method for fabricating a T-gate structure. A structure is provided that has a silicon layer having a gate oxide layer, a polysilicon layer over the gate oxide layer and an insulating layer over the gate oxide layer. A photoresist layer is formed over the insulating layer. The thick photoresist layer has a thickness within the range of about 1000 Å to 15000 Å. The photoresist layer is etched to form an opening in the photoresist layer exposing a portion of the underlying insulating layer. The etching is highly selective to the photoresist layer over the underlying insulating layer. Another etching is performed on the exposed insulating layer to extend the opening partially into the insulating layer. The etching is highly selective to the photoresist layer over the underlying insulating layer. The opening in the insulating layer extends from a top surface of the insulating layer to a first depth. The photoresist layer is swelled to reduce the size of the opening in the photoresist layer by wetting the photoresist layer with a solvent. Yet another etch step is performed to extend the opening in the insulating layer from the first depth to the polysilicon layer. The opening is wider from the top surface of the insulating layer to the first depth than the opening is from the first depth to the polysilicon layer. The opening is then filled with a conductive material. The insulating layer is removed and the gate oxide and polysilicon layer that does not underly the conductive material are then removed.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
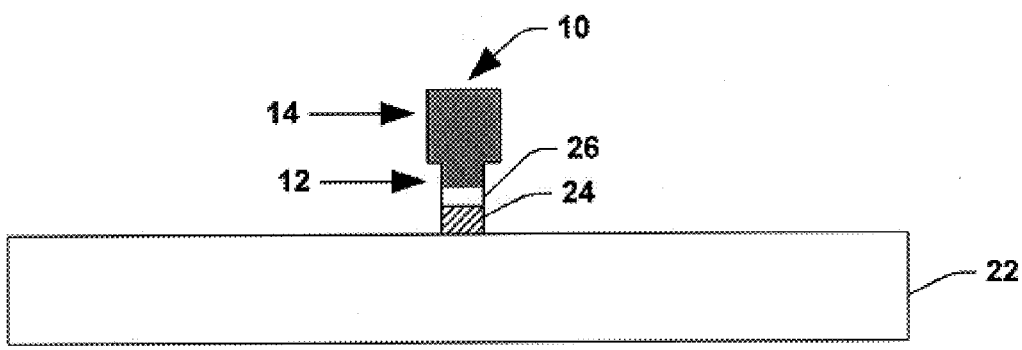
FIG. 1 is a schematic cross-sectional illustration of a T-gate structure overlying a silicon layer in accordance with one aspect of the invention.

The present invention will now be described with reference to the drawings, wherein like reference numerals are used to refer to like elements throughout. The present invention is described with reference to a method for forming a T-gate structure over a silicon layer to form a semiconductor with more speed and less power consumption. It is to be understood that the description of the various aspects of the present invention are merely illustrative and that they should not be taken in a limiting sense.

FIG. 1 illustrates a T-gate structure 10 according to the present invention. The T-gate structure 10 resides over a silicon layer 22 and includes a base portion 12 and a top or contact portion 14. The base portion 12 has a gate oxide layer 24 and a silicon layer 26. The top or contact portion 14 is the gate contact area and can be comprised of polysilicon, germanium, amorphous silicon, metals or the like. The base portion 12 has a width that is smaller than the top portion 14.

Figure 2:
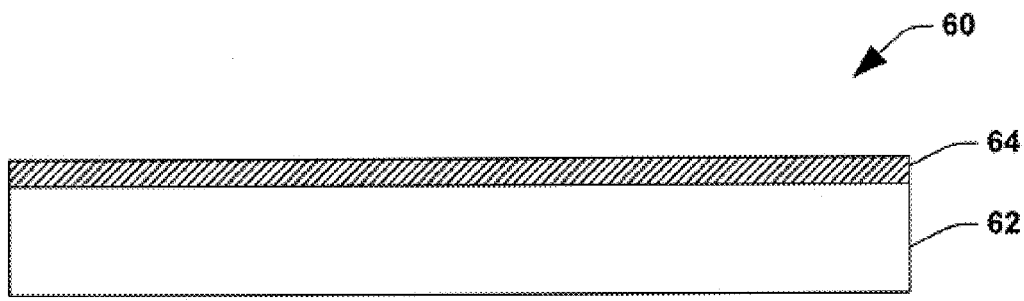
FIG. 2 is a schematic cross-sectional illustration of a silicon layer in accordance with one aspect of the present invention.
Figure 3:
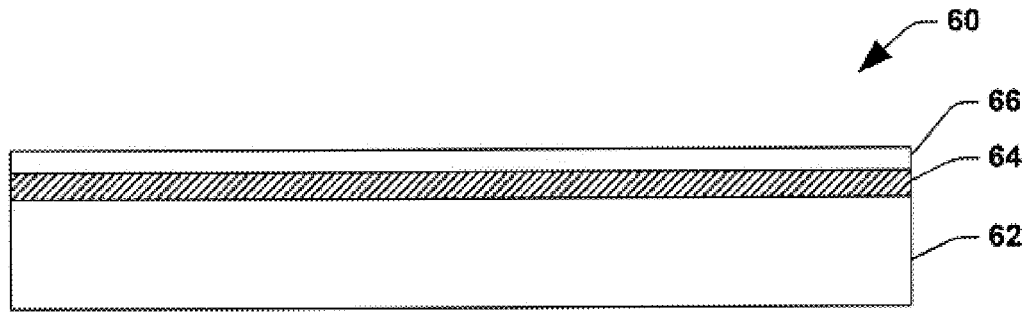
FIG. 3 is a schematic cross-sectional illustration of the silicon layer of FIG. 2 having a gate oxide layer in accordance with one aspect of the present invention.

FIGS. 2–14 illustrate a methodology of fabricating the T-gate structure of the present invention. FIG. 2 illustrates a structure 60 having a gate oxide layer 64 disposed over a silicon layer 62. The thin gate oxide material 64 is formed to have a thickness within the range of about 10–20 Å. Preferably, the thin gate oxide material 64 includes $SiO_2$ which has a substantially low dielectric constant. However, it is to be appreciated that any suitable material (e.g., $Si_3N_4$) for carrying out the present invention may be employed and is intended to fall within the scope of the present invention. A thin polysilicon material layer 66 is formed over the gate oxide material 64, as illustrated in FIG. 3. Preferably, the polysilicon material layer 66 is doped prior to the formation of the polysilicon material layer 66 over the gate oxide material 64. The polysilicon material layer may have a thickness similar to the thickness of the gate oxide material 64.

Figure 4:
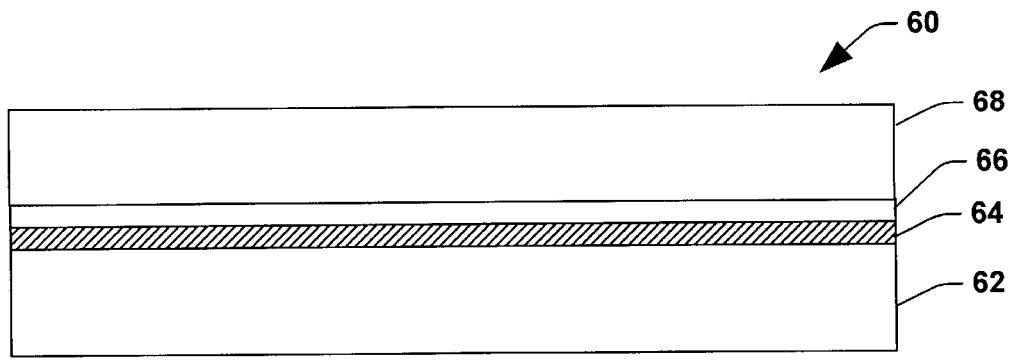
FIG. 4 is a schematic cross-sectional illustration of the structure of FIG. 3 having a polysilicon layer over the gate oxide layer in accordance with one aspect of the present invention.

An insulating layer 68 is formed over the thin polysilicon material layer 66 (FIG. 4). Any suitable technique (e.g., thermal oxidation, plasma enhanced chemical vapor deposition (CVD), thermal enhanced CVD and spin on techniques) may be employed in forming the insulating layer 68. Preferably, the insulating layer 68 is silicon dioxide ($SiO_2$) with a thickness of about 0.8 to 1.0 microns. Other usuable insulating materials are silicon nitride ($Si_3N_4$), (SiN), silicon oxynitride ($SiO_xN_y$), and fluonated silicon oxide ($SiO_xF_y$), and polyimide(s).

Figure 5:
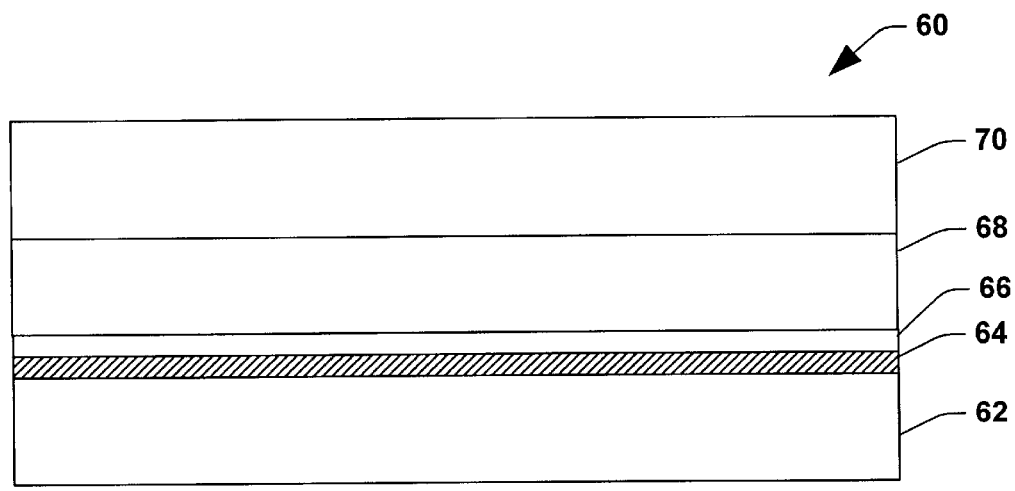
FIG. 5 is a schematic cross-sectional illustration of the structure of FIG. 4 having a photoresist layer over the polysilicon layer in accordance with one aspect of the present invention.
Figure 6:
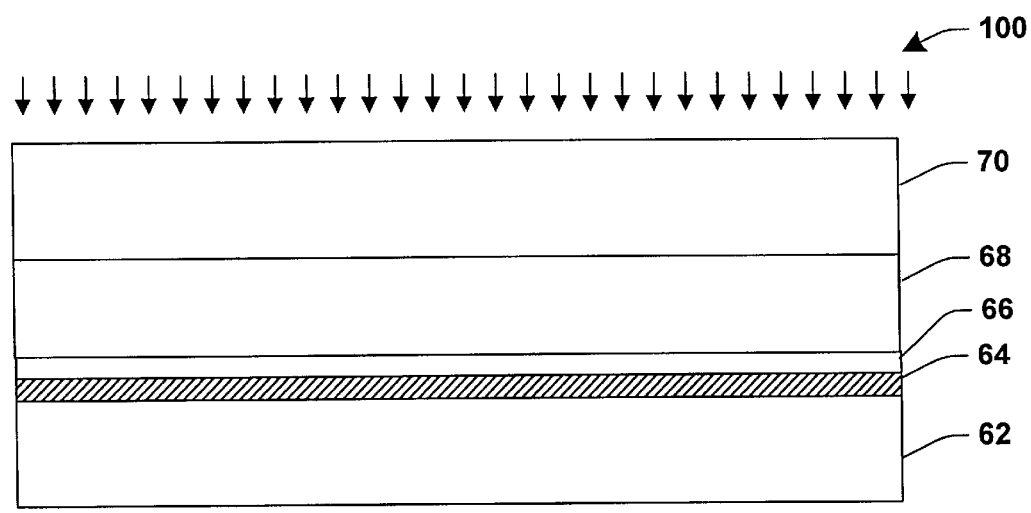
FIG. 6 is a schematic cross-sectional illustration of the structure of FIG. 5 undergoing an etching step in accordance with one aspect of the present invention.

A thick photoresist layer 70 is formed on the insulating layer 68 as illustrated in FIG. 5. The thick photoresist layer 70 has a thickness of about 1000 Å–15,000 Å, however, it is to be appreciated that the thickness thereof may be of any dimension suitable for carrying out the present invention. Accordingly, the thickness of the thick photoresist layer 70 can vary in correspondence with the wavelength of radiation used to pattern the thick photoresist layer 70. One aspect of the present invention provides for forming the thick photoresist layer 70 to have a thickness within the range of 1000 Å to 12,000 Å. Another aspect of the present invention provides for forming the thick photoresist layer 70 to have a thickness within the range of 2000 Å to 10,000 Å. Yet another aspect of the present invention provides for forming the thick photoresist layer 70 to have a thickness within the range of 2000 Å to 8000 Å. The thick photoresist layer 70 may be formed over the insulating layer 68 via conventional spin-coating or spin casting deposition techniques.

Figure 7:
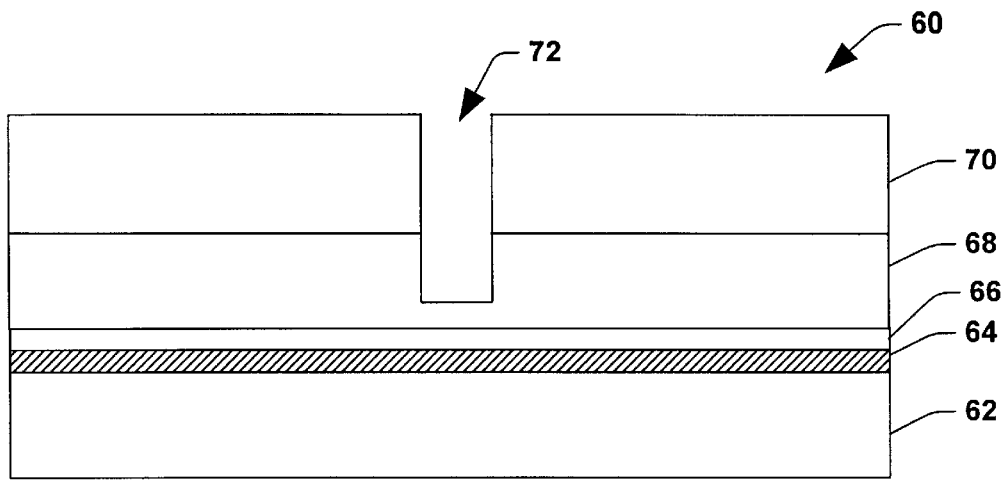
FIG. 7 is a schematic cross-sectional illustration of the structure of FIG. 6 after the photoresist layer has been etched and the underlying insulating layer has been partially etched in accordance with one aspect of the present invention.

An etch step 100 (e.g., anisotropic reactive ion etching (RIE)) (FIG. 6) is performed to form an opening 72 in the photoresist layer 70 and the oxide layer 68 (FIG. 7). The photoresist layer 70 is first patterned (not shown) and is used as a mask for selectively etching the insulating layer 68 to provide the opening 72 in the insulating layer 68. Preferably, a selective etch technique is used to etch the material of the photoresist layer 70 at a relatively greater rate as compared to the rate that the material of the insulating layer 68. Any suitable etch technique may be used to etch the insulating layer 68. For example, the insulating layer 68 at the opening 72 is anisotropically etched with a plasma gas(es), herein carbon tetraflloride ($CF_4$) containing fluorine ions, in a commercially available etcher, such as a parallel plate RIE apparatus or, alternatively, an electron cyclotron resonance (ECR) plasma reactor to replicate the mask pattern of the patterned of the photoresist layer 70 to thereby create the opening 72 in the insulating layer 68. Preferably, a selective etch technique is used to etch the material of the insulating layer 68 at a relatively greater rate as compared to the rate that the material of the patterned photoresist 70. The insulating layer 68 is partially etched so that a portion of the insulating material remains below the first opening 72.

Figure 8:
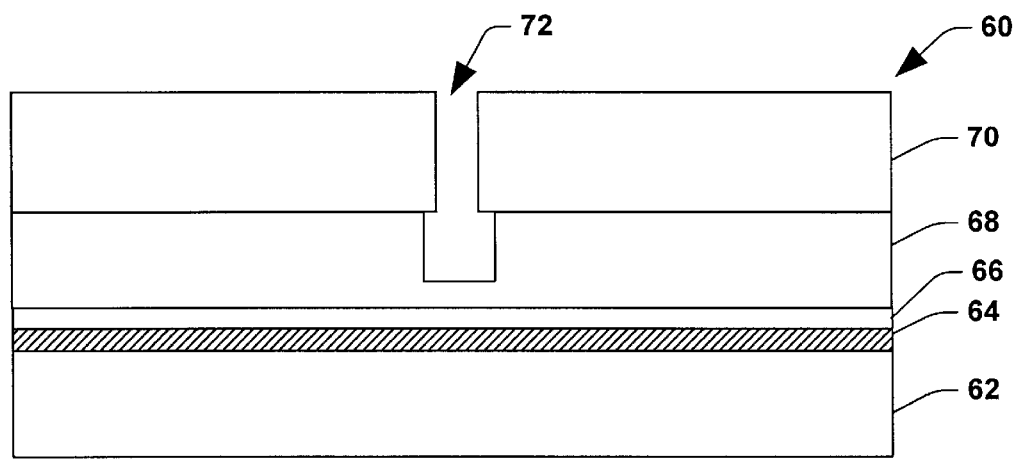
FIG. 8 is a schematic cross-sectional illustration of the structure of FIG. 7 after the photoresist layer has been swelled in accordance with one aspect of the present invention.
Figure 9:
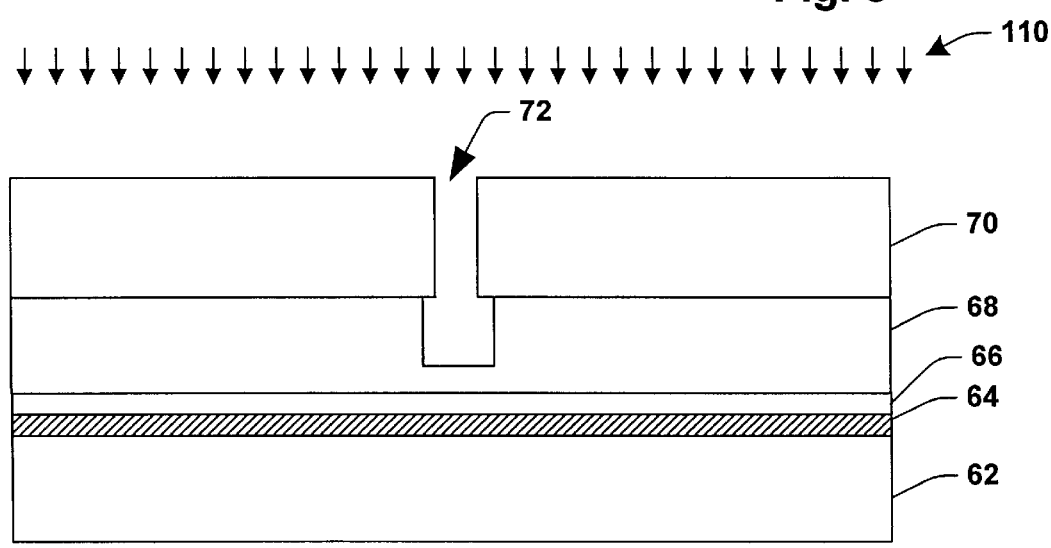
FIG. 9 is a schematic cross-sectional illustration of the structure of FIG. 8 undergoing another etching step in accordance with one aspect of the present invention.

FIG. 8 illustrates the structure 60 after the resist layer 70 undergoes a relacs process to swell the resist so that it covers a portion of the opening 72 exposing the underlying oxide layer 68. The resist can be swelled by wetting the resist with a solvent or by treating the resist with an organic material, such as a saturated hydrocarbon (e.g., aliphatic or aromatic hydrocarbon). Alternatively, the resist can be a hydrophilic resin with swelling properties. The swelled resist forms an opening 72'. The size of the opening 72' is about the size of an ultimate base of the gate to be formed. It is to be appreciated that other known methods for swelling the resist may be employed.

Figure 10:
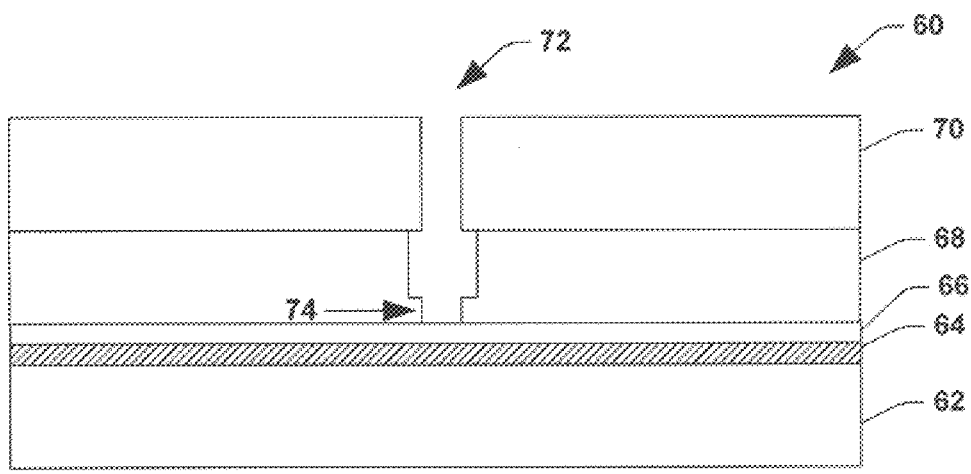
FIG. 10 is a schematic cross-sectional illustration of the structure of FIG. 9 after undergoing another etching step in accordance with one aspect of the present invention.

A second etch step 110 (e.g., anisotropic reactive ion etching (RIE)) (FIG. 9) is performed to form an opening 74 in the oxide layer 68 (FIG. 10). Any suitable etch technique may be used to etch the insulating layer 68. For example, the insulating layer 68 at the opening 72' is anisotropically etched with a plasma gas(es), herein carbon tetrafloride ($CF_4$) containing fluorine ions, in a commercially available etcher, such as a parallel plate RIE apparatus or, alternatively, an electron cyclotron resonance (ECR) plasma reactor to replicate the mask pattern of the patterned photoresist layer 70 to thereby extend the opening 72 in the insulating layer 68. Preferably, a selective etch technique is used to etch the material of the insulating layer 68 at a relatively greater rate as compared to the rate that the material of the patterned photoresist 70 and an etch technique that etches the insulating layer 68 at a greater rate than the underlying silicon layer 66.

Figure 11:
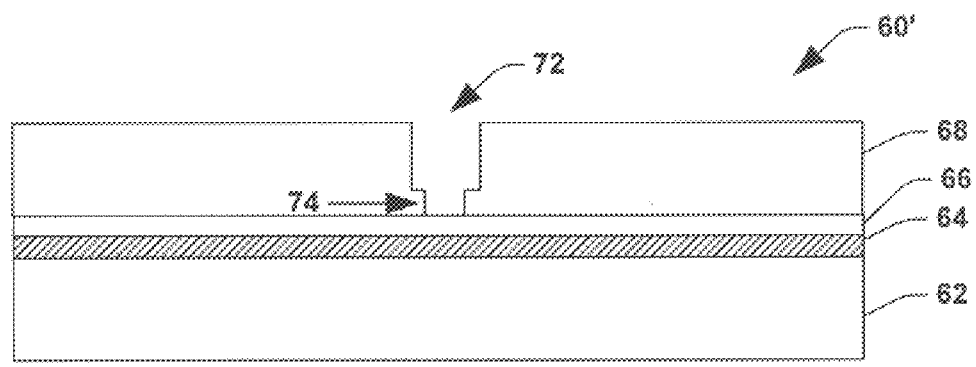
FIG. 11 is a schematic cross-sectional illustration of the structure of FIG. 10 after undergoing a stripping step in accordance with one aspect of the present invention.
Figure 12:
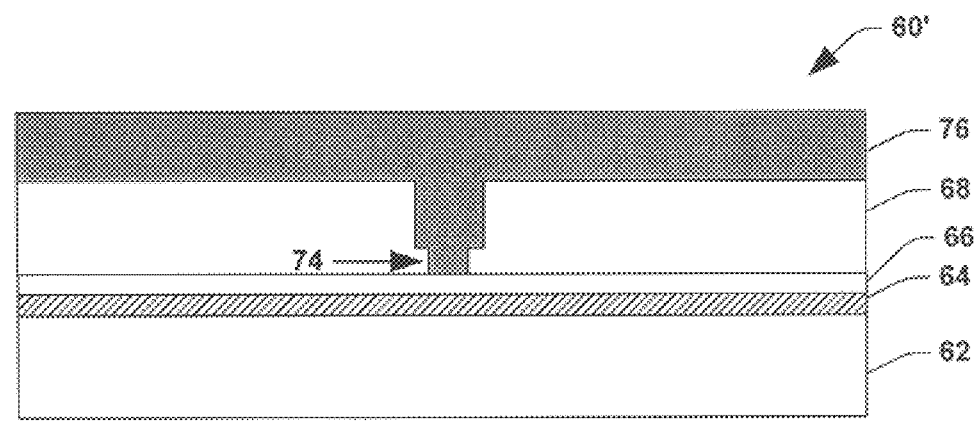
FIG. 12 is a schematic cross-sectional illustration of the structure of FIG. 11 after undergoing a contact layer fill step in accordance with one aspect of the present invention.
Figure 13:
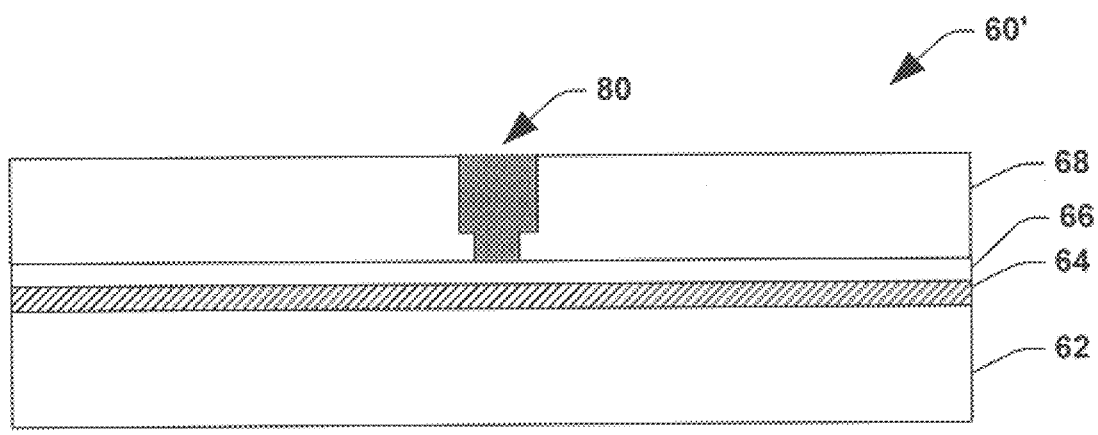
FIG. 13 is a schematic cross-sectional illustration of the structure of FIG. 12 after undergoing a polished back step in accordance with one aspect of the present invention.
Figure 14:
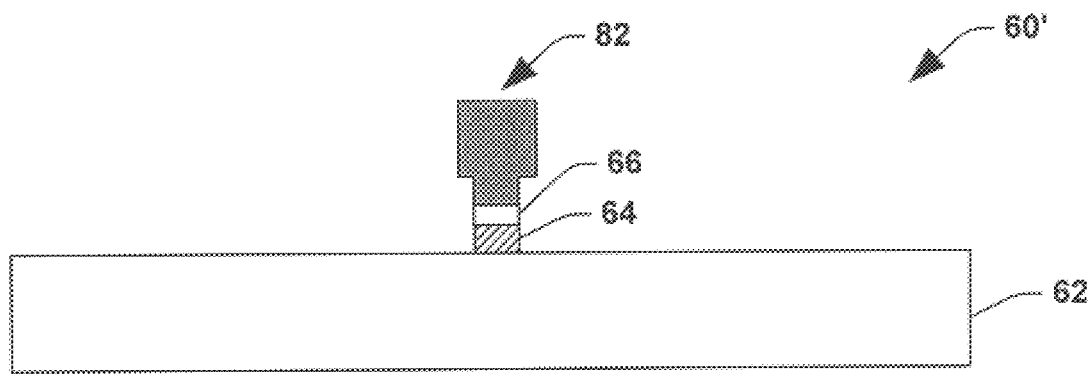
FIG. 14 is a schematic cross-sectional illustration of the structure of FIG. 13 after undergoing an insulator, oxide and polysilicon removal step in accordance with one aspect of the present invention.

FIG. 11 illustrates a partially complete structure 60' after a stripping step (e.g., ashing in an $O_2$ plasma) is substantially complete for removing the remaining portions of the photoresist layer 70. Next, a deposition step is performed on the structure 60' (FIG. 12) to form a contact layer 76 over the structure 60'. The contact layer 76 can be comprised of polysilicon, amorphous silicon, germanium, metals or the like. If the contact layer 76 is comprised of polysilicon, the contact layer 76 may be formed using any suitable technique including chemical vapor deposition (CVD) techniques, such as low pressure chemical vapor deposition (LPCVD) or plasma enhanced chemical vapor deposition (PECVD). If the contact layer 76 is comprised of amorphous silicon or germanium, standard deposition techniques may be employed. If the contact layer 76 is comprised of a metal, standard sputtering techniques may be employed. FIG. 13 illustrates the structure 60' after a polished back step is performed to remove a predetermined thickness of the contact layer 76. Preferably, the polished back step is performed to remove an amount of the contact layer 76 equivalent to the thickness of the contact layer 76 overlying the underlying insulating layer 68. FIG. 14 illustrates a complete T-gate structure 82 after insulating layer 68 and portions of the polysilicon layer 66 and gate oxide layer 64 not underlying the contact material are removed.

What has been described above are preferred embodiments of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A method for fabricating a T-gate structure comprising the steps of:

providing a silicon layer having a gate oxide layer, a polysilicon layer over the gate oxide layer and an insulating layer over the polysilicon layer;

forming a photoresist layer over the insulating layer;

forming an opening extending through the photoresist layer and partially into the insulating layer, the opening in the insulating layer extending from a top surface of the insulating layer to a first depth;

swelling the photoresist layer to reduce the size of the opening in the photoresist layer;

extending the opening in the insulating layer from the first depth to a second depth wherein the opening is wider from the top surface of the insulating layer to the first depth than the opening is from the first depth to the second depth; and filling the opening with a conductive material.

2. The method of claim 1, the insulating layer including at least one of silicon oxide, silicon dioxide, silicon nitride, silicon oxynitride, fluonated silicon oxide and polyimide(s).

3. The method of claim 1, the step of filling the opening with a conductive material comprising the step of filling the opening with one of polysilicon, germanium, amorphous polysilicon and metal.

4. The method of claim 1, the step of forming a first opening extending through the photoresist layer and partially into the insulating layer comprising a first step of etching a first opening in the photoresist layer to expose the insulating layer and a second step of partially etching the exposed insulating layer to extend the first opening.

5. The method of claim 4, the first etching step being highly selective to the photoresist layer over the insulating layer.

6. The method of claim 4, the second etching step being highly selective to the insulating layer over the photoresist layer.

7. The method of claim 1, the step of extending the opening in the insulating layer from the first depth to a second depth comprising performing an etch step being highly selective to the insulating layer over the photoresist layer and the underlying polysilicon layer.

8. The method of claim 1, the second depth extending to the underlying polysilicon layer.

9. The method of claim 1, the step of swelling the photoresist layer to reduce the size of the opening in the photoresist layer comprising wetting the resist with a solvent.

10. The method of claim 1, the step of swelling the photoresist layer to reduce the size of the opening in the photoresist layer comprising treating the resist with an organic material.

11. The method of claim 1, the step of swelling the photoresist layer to reduce the size of the opening in the photoresist layer comprising using a hydrophilic resin with swelling properties.

12. The method of claim 1, further comprising the step of removing the insulating layer after the step of filling the opening with a conductive material.

13. The method of claim 12, further comprising the step of removing the gate oxide material and the polysilicon layer not underlying the conductive material after the step of filling the opening with a conductive material.

14. The method of claim 1, further including the step of forming the photoresist layer to have a thickness within the range of about 1000 Å to 15000 Å.

15. The method of claim 1, further including the step of forming the photoresist layer to have a thickness within the range of about 1000 Å to 12000 Å.

16. The method of claim 1, further including the step of forming the photoresist layer to have a thickness within the range of about 200 Å to 8000 Å.

17. A method for fabricating a T-gate structure comprising the steps of:

providing a silicon layer having a gate oxide layer, a polysilicon layer over the gate oxide layer and an insulating layer over the polysilicon layer;

forming a photoresist layer over the insulating layer;

etching an opening in the photoresist layer exposing a portion of the insulating layer;

etching partially the exposed portion of the insulating layer to extend the opening partially into the insulating layer, the opening in the insulating layer extending from a top surface of the insulating layer to a first depth;

swelling the photoresist layer to reduce the size of the opening in the photoresist layer;

etching the opening in the insulating layer from the first depth to a second depth wherein the opening is wider from the top surface of the insulating layer to the first depth than the opening is from the first depth to the second depth;

filling the opening with a conductive material; and removing the insulating layer and the gate oxide and polysilicon layer not underlying the conductive material.

18. The method of claim 17, the second depth extending to the underlying polysilicon layer.

19. The method of claim 17, the step of swelling the photoresist layer to reduce to size of the opening in the photoresist layer comprising wetting the resist with a solvent.

20. A method for fabricating a T-gate structure comprising the steps of:

providing a silicon layer having a gate oxide layer, a polysilicon layer over the gate oxide layer and an insulating layer over the gate oxide layer;

forming a photoresist layer over the insulating layer, the photoresist layer having a thickness within the range of about 1000 to 15000;

etching an opening in the photoresist layer exposing a portion of the insulating layer, the etching being highly selective to the photoresist layer over the underlying insulating layer;

etching the exposed portion of the insulating layer to extend the opening partially into the insulating layer, the opening in the insulating layer extending from a top surface of the insulating layer to a first depth, the etching being highly selective to the insulating layer over the photoresist layer;

swelling the photoresist layer to reduce the size of the opening in the photoresist layer by wetting the photoresist layer with a solvent;

etching the opening in the insulating layer from the first depth to the polysilicon layer wherein the opening is wider from the top surface of the insulating layer to the first depth than the opening is from the first depth to the polysilicon layer;

filling the opening with a conductive material; and removing the insulating layer and the gate oxide and polysilicon layer not underlying the conductive material.

* * * * *